(12) United States Patent
Amemiya et al.

(10) Patent No.: US 6,455,203 B1
(45) Date of Patent: Sep. 24, 2002

(54) MASK STRUCTURE AND METHOD OF MANUFACTURING THE SAME

(75) Inventors: Mitsuaki Amemiya, Oomiya; Shunichi Uzawa, Tokyo; Keiko Chiba, Utsunomiya, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/545,464

(22) Filed: Apr. 7, 2000

(30) Foreign Application Priority Data

Apr. 12, 1999 (JP) .................................. 11-103909

(51) Int. Cl.$^7$ ............................... G03F 9/00; G03C 5/00
(52) U.S. Cl. ............................................ 430/5; 430/394
(58) Field of Search ........................... 430/5, 22, 30, 430/394; 250/492.3

(56) References Cited

U.S. PATENT DOCUMENTS

| | | | |
|---|---|---|---|
| 4,610,940 A | 9/1986 | Araihara | 430/5 |
| 5,422,205 A | 6/1995 | Inoue et al. | 430/5 |
| 5,424,154 A | 6/1995 | Borodovsky | 430/5 |
| 5,563,012 A | * 10/1996 | Neisser | 430/5 |
| 5,968,686 A | * 10/1999 | Yamada et al. | 430/5 |

* cited by examiner

Primary Examiner—S. Rosasco
(74) Attorney, Agent, or Firm—Fitzpatrick, Cella, Harper & Scinto

(57) ABSTRACT

A mask manufacturing method includes performing a multiple exposure process to a substrate so that a number of latent images are formed on the substrate, and processing the exposed substrate to produce actual mask patterns, wherein the multiple exposure process includes a first exposure step for forming a latent image of relatively-fine periodic patterns on the substrate by use of a first master mask having absorptive periodic patterns, and a second exposure step for forming a latent image of relatively-rough patterns on the substrate by use of a second master mask having absorptive patterns.

14 Claims, 9 Drawing Sheets

MASK STRUCTURE AND METHOD OF MANUFACTURING THE SAME

FIELD OF THE INVENTION AND RELATED ART

This invention relates to a mask and a device manufacturing method using the same, for use in the production of various devices such as semiconductor chips (e.g., ICs or LSIs), display devices (e.g., liquid crystal panels), detecting devices (e.g., magnetic heads), or image pickup devices (e.g., CCDs), for example.

Due to increases in density and speed of a semiconductor integrated circuit, the linewidth of a pattern of an integrated circuit has been narrowed and further improvements in performance of semiconductor manufacturing methods have been required. In order to meet such requirements, in the field of exposure apparatuses for forming a resist pattern in a lithography process, among semiconductor manufacturing processes, steppers which use shorter exposure wavelengths such as extreme ultraviolet light (e.g., KrF laser (248 nm), ArF laser (193 nm) or $F_2$ laser (157 nm)) or X-rays (0.2–15 nm), for example, have been developed.

In an exposure process using extreme ultraviolet light, usually reduction exposure of 4:1 to 5:1 is performed. Therefore, a reticle (original) is formed with a pattern of a size which is 4× to 5× larger than a pattern to be produced on a wafer. In an X-ray proximity exposure process which is a unit magnification process, on the other hand, an X-ray mask (original) should have a very fine pattern of the same size as a pattern to be produced. For this reason, the X-ray mask manufacture is one of the key technologies in the X-ray proximity exposure.

Referring to FIGS. 10A–10F, a conventional X-ray mask manufacturing method will be described.

As shown in FIG. 10A, a supporting frame 1 is provided by a Si substrate, on which an X-ray transmissive film 2 made from a SiC film is formed. As shown in FIG. 10B, an X-ray transmission region is defined, by etching the supporting frame 1. Thereafter, an X-ray absorptive material 3 is provided by a film of W, whereby a structure shown in FIG. 10C is produced. The film formation may be made before the etching process in FIG. 10B.

Subsequently, an electron-beam resist 4 is applied to the substrate, whereby a structure shown in FIG. 10D is obtained. Because of X-ray exposure of unit magnification, data is prepared to draw a pattern exactly the same as a pattern to be produced on a wafer (workpiece). Then, while using an electron-beam exposure apparatus, the electron-beam resist is patterned. Through a subsequent development process, a resist pattern such as shown in FIG. 10E is produced. Then, as shown in FIG. 10F, a dry etching process is performed, whereby a desired pattern of X-ray absorptive material is produced. The X-ray transmitting region (not shown) may be formed after the formation of the X-ray absorptive material pattern. With the procedure described above, an X-ray mask having an X-ray absorptive material of desired shape is produced.

In the conventional X-ray mask manufacturing procedure such as described above, there are limits in resolution and positional precision, for the following reasons.

As regards electron-beam pattern drawing apparatuses used for the manufacture of originals, the position of electron beam irradiation is controlled by applying an electromagnetic or electrostatic field to an electron beam to deflect the same. Thus, the controllability of an electric voltage to be applied to a deflector is critical to the position control for a pattern. Usually, in order to draw a very fine pattern, the drawing is performed while the beam is restricted narrow. Therefore, the voltage level is low, while the data is huge. Both the data transfer time and the patterning time are very long, and finally it takes an extraordinarily long time (more than a few hours) to finish the patterning for an X-ray mask. This causes a possibility of drift during the patterning process. Particularly, in the case of a chemical amplification type resist which has recently been developed for resolution of a very narrow linewidth, the oxide diffusion distance may vary during a time period from exposure to baking, which is critical to the linewidth and shape of the resist. It is, therefore, not easy to use these types of resist materials in the patterning exposure process, which requires a very long time.

As described above, in accordance with current mask manufacturing procedures using electron beam patterning technologies, the electron beam has to be narrowed to increase the resolution, but it causes considerable prolongation of the patterning time, on one hand, and undesirable degradation of positional precision, on the other hand. Further, the required electron-beam patterning time adversely affects the throughput and cost of the X-ray mask production.

U.S. Pat. No. 5,623,529 proposes a method of reproducing an X-ray mask on the basis of X-ray exposure, in an attempt to increase the throughput and reduce the cost. Since, however, an original itself for X-ray masks has to be produced using electron-beam drawing, there still remain inconveniences although the resolution and positional precision may be improved.

SUMMARY OF THE INVENTION

It is an object of the present invention to provide a mask manufacturing method by which a high precision mask can be produced.

It is another object of the present invention to provide an X-ray mask manufacturing method by which an X-ray mask having a very high precision, higher than one attainable with current technologies, can be produced with use of a current electron-beam patterning apparatus and exposure apparatus, with a result of improved throughput and reduced cost.

It is a further object of the present invention to provide a high precision X-ray mask such as described above.

It is a yet further object of the present invention to provide an X-ray exposure method, an X-ray exposure apparatus, a semiconductor device, and a semiconductor device manufacturing method, using such an X-ray mask.

In accordance with an aspect of the present invention, there is provided a mask manufacturing method, comprising the steps of: performing a multiple exposure process to a substrate so that a number of latent images are formed on the substrate; and processing the exposed substrate to produce actual mask patterns.

The multiple exposure process may include (i) a first exposure step for forming a latent image of relatively-fine periodic patterns on the substrate by use of a first master mask having absorptive periodic patterns, and (ii) a second exposure step for forming a latent image of relatively-rough patterns on the substrate by use of a second master mask having absorptive patterns.

The first exposure step may include transferring a pattern of the first mask onto the substrate with a magnification 1/N where N is an integer not less than 2.

The first exposure step may include adjusting a gap between the first mask and the substrate.

The processing step may include a developing step and an etching step.

The first mask may be prepared by use of a first electron beam, and the second mask may be prepared by use of a second electron beam having an address size and a beam diameter, at least one of which may be different from that of the first electron beam.

In accordance with another aspect of the present invention, there is provided a mask manufacturing method, comprising the steps of: preparing a first mask through a procedure including (i) a first exposure step for forming a latent image of relatively-fine periodic patterns on a substrate by use of a first master mask having absorptive periodic patterns, and (ii) a second exposure step for forming a latent image of relatively-rough patterns on the substrate by use of a second master mask having absorptive patterns; and preparing a second mask through a procedure including (iii) a third exposure step for forming a latent image of relatively-fine periodic patterns on a substrate by use of a third master mask having absorptive periodic patterns, and (iv) a fourth exposure step for forming a latent image of relatively-rough patterns on the substrate by use of a fourth master mask having absorptive patterns; wherein the third master mask is the same as the first master mask.

The method described above may be used to produce a mask to be used for X-ray lithography.

The mask to be produced may comprise a structure having a membrane on which the actual mask patterns are formed, and a frame for supporting the membrane.

In accordance with a further aspect of the present invention, there is provided a semiconductor device manufacturing method, comprising the steps of: preparing a mask by performing a multiple exposure process to a substrate so that a number of latent images are formed on the substrate, and by processing the exposed substrate to produce actual mask patterns; and using the prepared mask in an exposure process so that the actual mask patterns are transferred to a wafer, for manufacture of semiconductor devices.

The exposure process may use X-rays.

In accordance with a yet further aspect of the present invention, there is provided an exposure apparatus for transferring a mask pattern onto a substrate, by use of a mask prepared in accordance with a method such as described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2C are graphs, respectively, for explaining exposure amount distributions, wherein FIG. 2A shows an exposure amount distribution of a fine pattern, FIG. 2B shows an exposure amount distribution of a rough pattern, and FIG. 2C shows an exposure amount distribution as obtainable with transfer of a fine pattern and a rough pattern.

FIGS. 3A–3F are schematic views of various patterns, respectively, wherein FIGS. 3A, 3B and 3C show fine patterns, FIG. 3D shows a rough mask, and FIGS. 3E and 3F show rough masks to be used in a process wherein the mask pattern of FIG. 3D is divided and printed.

FIGS. 4A–4C are schematic views, respectively, for explaining exposure gap control, wherein FIG. 4A shows an exposure gap, FIG. 4B shows an intensity distribution to be produced with a small exposure gap, and FIG. 4C shows an intensity pattern of a period of a half of a mask pattern, which can be produced through the exposure gap control.

DESCRIPTION OF THE PREFERRED EMBODIMENTS

For mask structure, the present invention uses an exposure process by which a pattern can be produced with a high resolution and a good positional precision. In this exposure process, a fine pattern exposure and a rough pattern exposure are performed to a layer on a substrate in duplication (dual exposure) or in multiple (multiple exposure), by which an improved resolution is attained. This exposure process will be described below.

The fine pattern exposure is an exposure process for printing a pattern having a periodic structure. In the dual or multiple exposure process, after a fine pattern is printed on a layer of a substrate, a rough pattern corresponding to a desired resist pattern is printed on the same layer in duplication or in multiple. Then, a development process is performed under such condition that the fine pattern in a portion (position) where the rough pattern is printed can remain. Either the fine pattern exposure or the rough pattern exposure may be made first. The exposure amounts in these exposures are determined so that a best resist pattern is produced.

In accordance with such a dual or multiple exposure process, the resolution and the positional precision can be improved significantly, as compared with conventional exposure methods wherein a single original is used for exposure of a certain layer on the substrate. In the case of proximity exposure, the shape of a pattern of a rough mask and the shape of a pattern to be produced on a workpiece are in a mirror-image relation and, therefore, the shape of a rough pattern is determined while taking this into account.

Figure 3A:
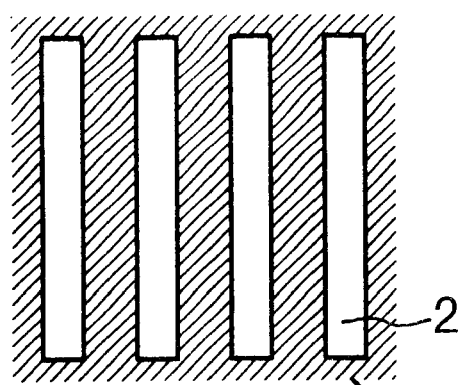

A rough pattern and a fine pattern will be explained in more detail. A fine pattern is a pattern which has a linewidth narrower than a desired resist pattern to be produced through a development process, and also which has a predetermined periodic structure. As shown in FIG. 3A, for example, it may comprise a line-and-space pattern defined by an X-ray absorptive material 3 and an X-ray transmissive film 2, or a checker board type pattern (FIG. 3B) or a grating-like pattern (FIG. 3C), all being defined by dividing a resist in accordance with a predetermined rule.

Figure 3B:
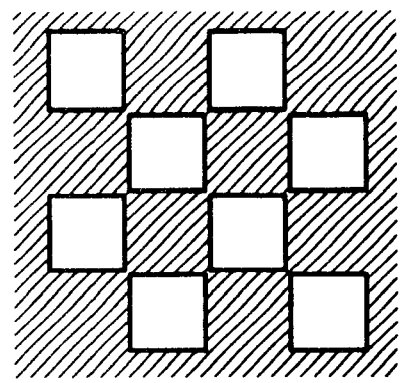
Figure 3C:
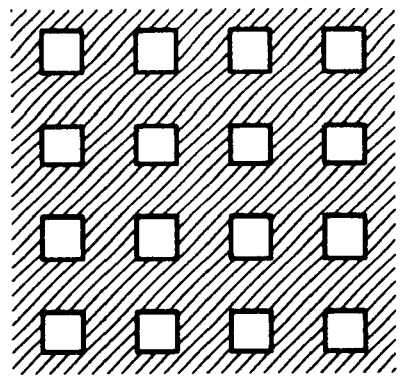
Figure 3D:
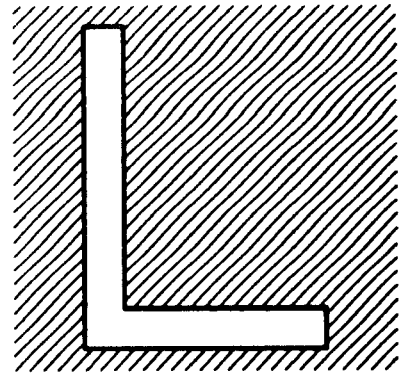
Figure 3E:
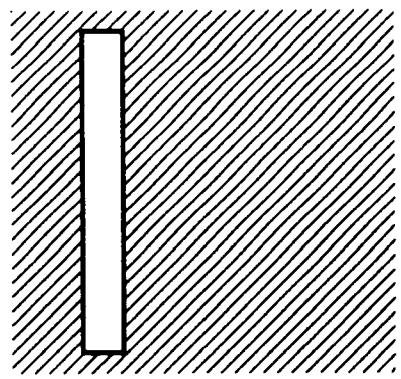
Figure 3F:
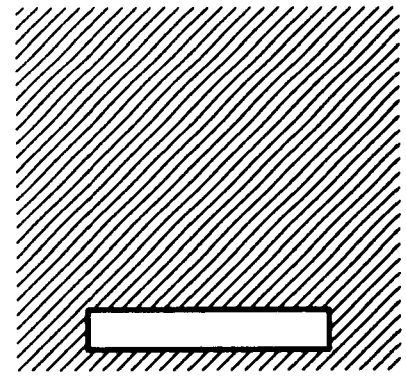

As compared therewith, a rough pattern is a pattern which corresponds to a desired resist pattern (resist image) to be produced through a development process. As an example, in a case where two linear resist patterns are to be produced, two linear window patterns to be superposed upon a transferred fine pattern image are called a "rough pattern". The rough pattern should not always have the same shape as that of a desired resist pattern (resist image). Any auxiliary pattern for OPC, for example, for correcting an optical image, may be used. Further, a single resist image may be printed by some divided patterns. For example, in a case where an L-shaped pattern is to be printed, a rough mask such as shown in FIG. 3D may be used with a single exposure operation, or alternatively, the pattern may be divided into a longitudinal window and a lateral window (FIGS. 3E and 3F) so that a rough pattern image may be printed with two exposures using these window patterns.

The principle of dual or multiple exposure process described above can be applied to X-ray mask manufacture. An accurately transferred fine pattern image (periodic pattern image) and a rough pattern image corresponding to a desired resist image are printed superposedly, to produce an actual mask pattern for X-ray lithography.

An example will be described below. In this example, an fine mask having a fine pattern and a rough mask having a rough pattern are used as mask manufacturing master masks. These two types of masks are used with a dual or multiple exposure process, by which a very precise exposure mask is produced, as described below.

(1) X-ray Mask Manufacture

Figure 1A:
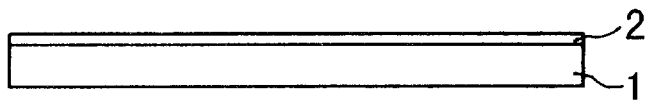
FIGS. 1A–1H are schematic views, respectively, for explaining a mask manufacturing procedure according to an embodiment of the present invention.
Figure 1B:
Figure 1C:
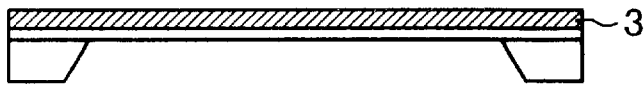
Figure 1D:
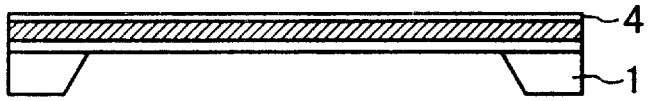
Figure 1E:
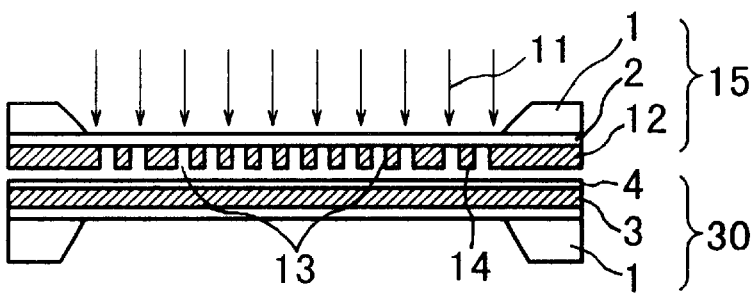
Figure 1F:
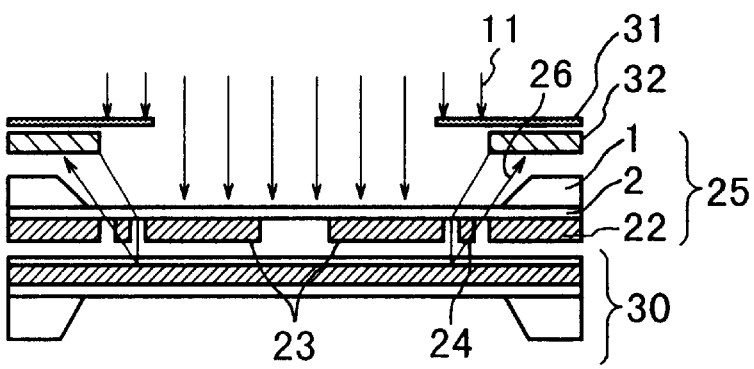

As shown in FIG. 1E, a fine pattern of a fine mask (first master mask for mask manufacture) is transferred to the substrate through an X-ray exposure. As a result of it, a latent image (periodic pattern image) of the fine pattern is formed on a resist which is provided on an X-ray transmissive film. Subsequently, as shown in FIG. 1F, a pattern 23 of a rough mask (second master mask for mask manufacture) is printed in duplication upon the resist 4 having a fine pattern image transferred thereto. Then, a development process is carried out.

Here, the position of the resist pattern to be resolved depends largely upon the position of the transferred fine pattern image. Further, the size of the resist pattern resolved is largely influenced by the fine pattern image. This is because a latent image formed on a resist results from superposition of a fine pattern image and a rough pattern image, and because only a portion of the resist exposed with an exposure amount larger than a certain threshold can remain as a resist pattern (actual pattern).

Therefore, provided that a fine pattern is formed accurately, the positional precision and the resolution of a rough pattern can be improved through the dual exposure process. As an example, where an electron beam is used to draw a line-and-space pattern, for preparation of a fine mask, the beam diameter of the electron beam may be narrowed, and the resolution for patterning position may be set fine. The electric current may be adjusted so that a mask is not displaced by the electron beam during the patterning operation. On the other hand, for preparation of a rough mask, the beam diameter of the electron beam may be enlarged, and the addressing which represents the resolution for patterning position may be loosened to some extent. Even with this procedure, the positional precision and resolution necessary for a product X-ray exposure mask can be assured. Therefore, the X-ray mask manufacturing operation can be simplified significantly. Further, as regards the fine mask, the same fine mask can be used regardless of the pattern of the rough mask. Therefore, once a high precision fine mask is prepared, it can be used repeatedly as a master mask for mask manufacture. Thus, the burden in preparation of a fine mask does not substantially increase the total burden of exposure mask manufacture.

(2) Mask To Be Used For Plural Layers

An X-ray mask can be used for plural layers. This will be described below, taking an example wherein there are layers #1 and #2 which are to be overlapped upon one another. A common fine mask can be used for the manufacture of exposure masks which are to be used for the layers #1 and #2. With this procedure, even if the fine mask has distortion in its pattern, since the patterns of the exposure masks for the layers #1 and #2 are produced by superposing a transferred image of a rough pattern upon a transferred image of the same fine mask, both the patterns of these exposure masks have the same distortion. Consequently, it does not lead to degradation of registration precision between the layers #1 and #2.

[Embodiment 1]

A first embodiment of the present invention will be described with reference to FIGS. 1A–1H.

The steps from FIG. 1A to FIG. 1D are similar to conventional mask manufacturing processes. Denoted at 1 is a mask supporting frame (Si wafer), and denoted at 2 is an X-ray transmissive film made of a SiC film and having a thickness of about 2 microns. Denoted at 3 is an X-ray absorptive material made of a W (tungsten) film of a thickness of about 0.2–0.5 micron. Denoted at 4 is a resist layer.

(Fine Pattern Transfer)

As shown in FIG. 1E, an X-ray exposure is performed so as to produce a fine pattern image on the resist layer 4 applied to the surface of a substrate 30, to be finally structured into an exposure X-ray mask. More specifically, a fine mask 15 (first master mask for mask manufacture) is held opposed to the substrate 30 with a suitable spacing maintained therebetween, and X-rays 11 are projected thereto from the above.

Here, the fine mask 15 comprises a pattern 12, an X-ray transmissive film 2 and a supporting frame 1. The pattern 12 includes a fine pattern 13 (absorptive material pattern 13 having a periodic structure) formed with a line-and-space shape, at a central portion of the mask, as well as alignment marks 14 formed in a peripheral portion of the mask. The pattern 12 has been formed by use of an electron beam, through conventional mask manufacturing processes.

Figure 2A:
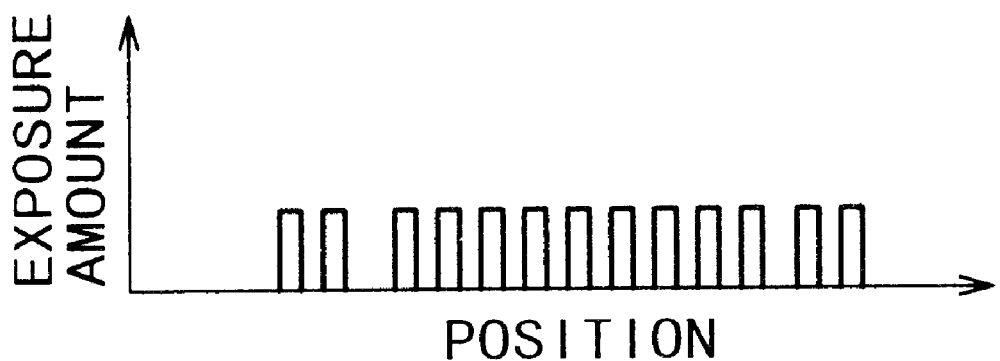

The exposure amount applied to the resist 4 through the exposure with the fine mask 15 is such as shown in FIG. 2A. It is to be noted here that, before a development process, a pattern corresponding to the fine pattern 12 is formed on the resist as a "latent image".

(Rough Pattern Transfer)

After the transfer of a fine pattern image (periodic pattern image), without execution of a development process, an X-ray exposure is performed to transfer a rough pattern image (FIG. 1F). Similarly to the fine pattern transfer process, a rough mask 25 (second master mask) is held opposed to the substrate 30 with a suitable spacing maintained therebetween, and X-rays 11 are projected thereto from the above.

The rough mask 25 comprises a pattern 22, an X-ray transmissive film 2 and a supporting frame 1. The pattern 22 includes a rough pattern 23 having windows (openings) at positions corresponding to a desired resist pattern (resist image) (more specifically, a rough pattern 23 provided by an absorptive material pattern corresponding to a desired resist image to be produced), as well as alignment marks formed in a peripheral portion of the mask.

In the present process, the rough pattern 23 has to be transferred superposedly upon the fine pattern image. To this end, first, the rough mask 25 is placed so that the alignment marks 24 of the rough mask 25 are registered with latent images of the alignment marks 14 having been formed in the preceding process. Subsequently, an alignment optical system 26 emits alignment light beams 26 which are projected on the alignment marks 24. The alignment light beams 26 are diffracted by each of the alignment marks 24, and they are projected on the latent images of the alignment marks 14 having been formed there in the preceding fine pattern transfer process. Thereafter, the alignment light beams go back to the alignment optical system 32. The alignment optical system 32 is arranged to produce a strongest signal as each alignment mark 24 and each latent image of the alignment mark 14 are registered with each other. Therefore, on the basis of the signal intensity therefrom the rough pattern can be aligned with respect to the fine pattern. Further, since the alignment marks 14 of the fine mask 15 and the alignment marks 24 of the rough mask are not used for an actual exposure process, a light blocking plate 31 may be used, if necessary, to block X-rays to prevent these alignment marks from being transferred.

Figure 2B:
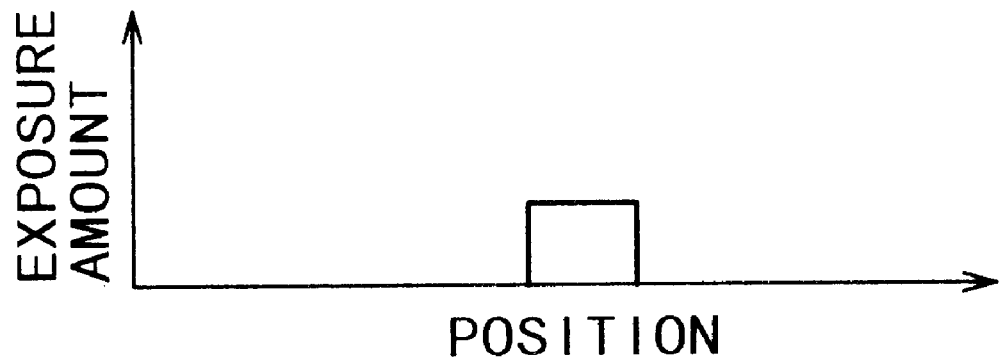
Figure 2C:
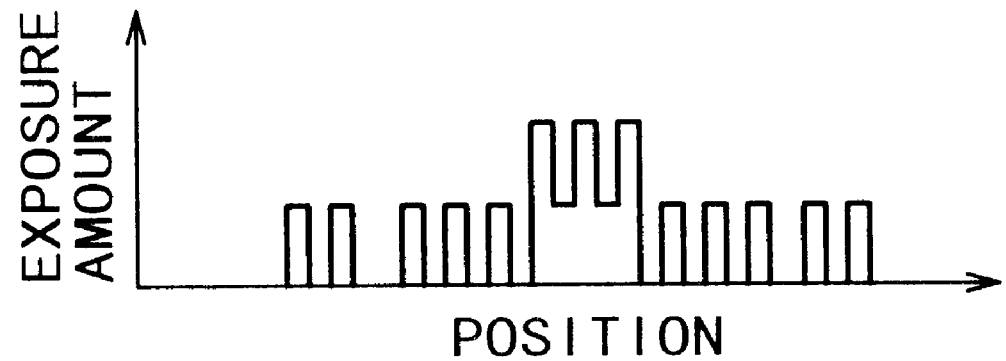

After the alignment of the rough mask 25 and the latent image of the fine pattern 13 is completed in this manner, X-rays are projected, whereby the rough pattern is transferred. The exposure amount additionally applied to the resist 4 through exposure of the rough mask 25 is such as shown in FIG. 2B. The total exposure amount applied to the resist by both of the fine mask 15 and the rough mask 25, is such as shown in FIG. 2C.

(Resist Development Process)

In this process, a slice level is so determined that a resist pattern of a desired shape can remain. The development is performed with this level. In this embodiment, the development process is performed so that three linear patterns remain at a central portion, as shown in FIG. 1G.

(Etching Process)

Figure 1G:
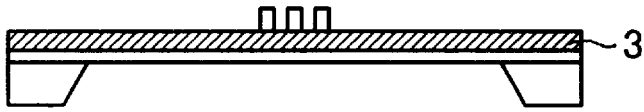
Figure 1H:
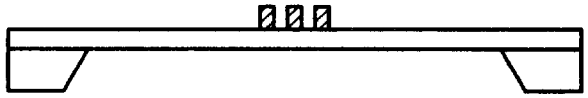

The resist pattern shown in FIG. 1G is then used as an etching mask. By etching the tungsten (W) 3 in this manner, an X-ray mask for X-ray lithography having a desired pattern, such as shown in FIG. 1H, is produced.

The exposure light intensity shown in FIG. 2C corresponds to the sum of X-ray intensities provided by the fine pattern and the rough pattern. Therefore, the resist pattern (FIG. 1G) after development largely depends on the position of the fine pattern and the shape thereof. As a result, a mask for exposure (lithography) having a very fine pattern, being narrower than the rough pattern 22 of the rough mask 25 and and having a better positional precision, can be produced.

As compared with a conventional method wherein an exposure (lithography) mask is directly patterned by use of an electron beam, in this embodiment the positioning precision for irradiation with an electron beam during the electron beam patterning process for manufacture of a rough mask can be loosened largely. Therefore, the positioning resolution for the electron beam can be made larger and, additionally, the electron beam size can be made larger. This directly leads to reduction in data transfer time and exposure time, such that the quantity of drift during the electron beam patterning process can be made small. Therefore, the positioning precision of a rough mask can be improved significantly.

In the fine pattern transfer process in this embodiment, a fine pattern of the same period as the fine mask pattern is produced. However, a fine pattern image of a period smaller than that of the fine mask pattern 13 can be transferred. This will be described below, in more detail.

Figure 4A:
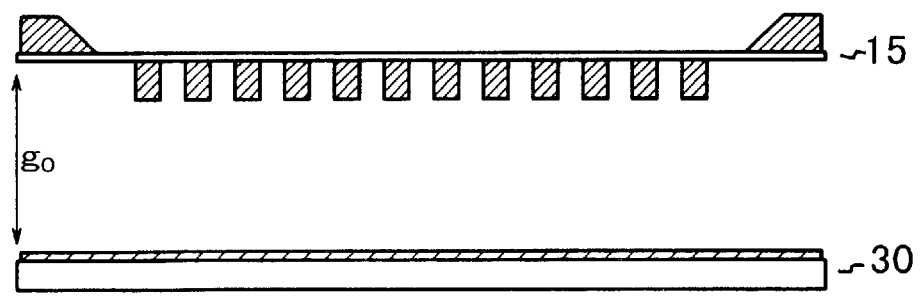
Figure 4B:
Figure 4C:

As shown in FIGS. 4A–4C, the diffraction condition changes if the exposure gap g which is the spacing between the substrate 30 and the fine mask 15 is controlled. In consideration of it, by controlling the gap, the X-ray intensities on the resist surface, corresponding to the center of the opening and center of the absorptive material, can be made even. If the exposure gap g is small, a pattern image (FIG. 4B) having a period the same as the period of the mask pattern is obtainable. By controlling the gap g, a pattern image (FIG. 4C) having a period a half of that of the mask pattern is obtainable.

For example, with the conditions that a tungsten (W) layer of a thickness of 0.40 micron, a line-and-space pattern of a period 0.2 micron and an exposure gap g of 32 microns, the X-ray intensities at the center of the absorptive material of the fine pattern and at the center of the opening thereof can be made even, such that a line-and-space pattern image of a period 0.1 micron, which is a half of the period of the mask pattern, can be produced. Further, by adjusting the exposure gap, even a fine pattern image of a period of 1/N of the period of the fine pattern can be produced (where N is a n integer not less than 2).

As described, an image of a period finer than a fine pattern can be produced. As a result of it, the positioning precision for electron beam irradiation during the fine mask manufacturing process can be loosened, and the addressing and the electron beam size can be made larger.

[Embodiment 2]

This embodiment concerns manufacture of an exposure (lithographic) mask to be used for plural layers. When a mask is manufactured on the basis of the multiple exposure process, not only is the resolution of the mask pattern (i.e., the dimensional precision thereof) improved but also the positioning precision thereof is improved, as has been described with reference to the first embodiment. In the present embodiment, when an exposure lithographic mask to be used for plural layers is manufactured a common fine mask is used as a mask manufacturing master mask. This is very effective in the following point. That is, when a fine pattern of a fine mask is being formed by using an electron beam, even if the temperature of an X-ray transmissive film of the fine mask, being exposed, rises due to heat and it causes draft and a consequent positional distortion of the fine pattern, as long as one and the same fine mask is used for the manufacture of plural exposure masks, the result is that the same distortion is reproduced in all the exposure masks produced.

Therefore, even if the mask pattern has distortion, as long as the exposure masks all having been manufactured by use of the same fine mask are used for pattern superposition processes, the result is that patterns which are going to be superposed one upon another have the same distortion. Consequently, it does not lead to degradation of registration precision.

In this example, depending on an exposure mask, there may be cases where a fine pattern is not present through the whole picture angle but a latent image of a fine pattern should be formed locally. Even in such cases, a common fine mask can be used for manufacture of exposure masks for plural layers to be registered with each other. For example, in a case where layers #1 and #2 have fine patterns in different regions within the picture angle and a latent image should be formed only in such region, the portion of the fine mask where no latent image should be formed may be blocked by using a light blocking plate, so as to prevent exposure of that portion with X-rays. By doing so, in exposure masks for layers #1 and #2, since any positional distortion of the pattern in the region where a fine pattern is present results from one and the same fine pattern, the registration precision with respect to the fine pattern region can be made high.

[Embodiment 3]

In the second embodiment, regarding the manufacture of exposure masks for layers #1 and #2, the fine pattern transfer process for them is performed so that an image of the same period as that of a fine pattern is produced. This embodiment concerns an example wherein a pattern of a half period as that of a layer #1 should be transferred to a layer #2, or wherein a pattern of a half linewidth as that of the layer #1 should be transferred to the layer #2.

Figure 5:
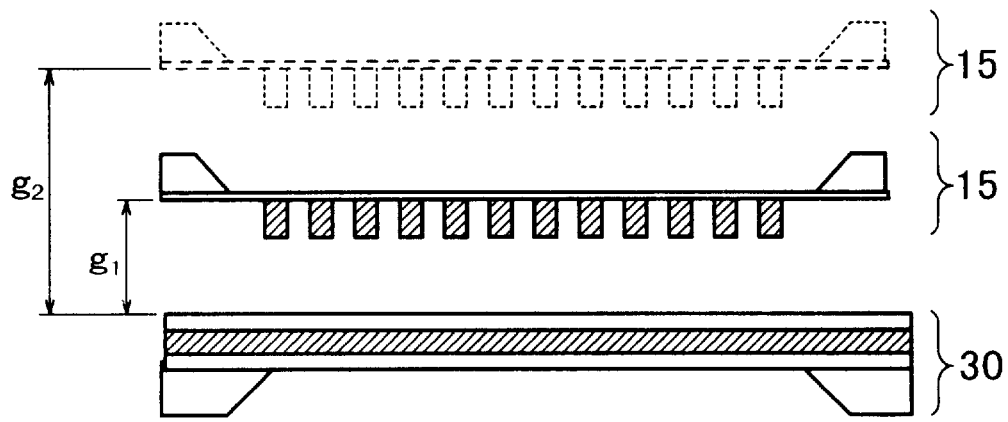
FIG. 5 is a schematic view for explaining an exposure process while changing an exposure gap.

In this embodiment, a common fine mask is used on one hand, and the exposure gap is controlled to change the period of an image to be transferred, on the other hand. For example, as shown in FIG. 5, in the fine pattern transfer process for the manufacture of an exposure mask for layer #1, the fine mask 15 is set with an exposure gap $g_1$, and exposure of the fine pattern is performed. As regards layer #2, the same fine mask is used and set with an exposure gap $g_2$, and exposure of that fine pattern is performed. More specifically, as regards a fine pattern having a W (tungsten) layer having a thickness of 0.40 micron and a line-and-space pattern of period 0.2 micron, a line-and-space pattern image of a period 0.2 micron can be transferred to layer #1 with the exposure gap $g_1$=10 microns, while a line-and-space pattern image of a period 0.1 micron can be transferred to layer #2 with the exposure gap $g_2$=32 microns.

As described above, as regards those layers having different periods or those patterns having different linewidths, one and the same fine mask can be used to perform the fine pattern transfer. The result is that plural exposure masks for plural layers have the same distortion, and thus, the registration precision between plural layers can be made high.

The embodiments described above can be modified in various ways. In the first embodiment, latent images of the alignment marks 14 of the fine mask are used for alignment between the rough mask and the substrate 30. However, the rough mask exposure may be made first and, by using the latent images of its alignment marks, the alignment of the fine mask may be made. Further, a third mask may be used to form latent images of alignment marks for aligning the fine mask and the rough mask with each other. A method other than one using a latent image may be used. For example, alignment marks may be produced on a W (tungsten) layer on the supporting frame 1, in accordance with a conventional mask manufacturing procedure.

Although the preceding embodiments have been described with reference to examples wherein a fine pattern has a line-and-space shape, if the fine pattern comprises a hole pattern, the fine pattern transfer process may involve two exposure steps. That is, the first exposure step may be performed by using a fine mask having a pattern of a line-and-space shape, extending in a lateral direction. Subsequently, the second exposure step may be performed by using a fine mask having a pattern of a line-and-space shape, extending in a longitudinal direction. Alternatively, a fine mask having a pattern such as shown in FIG. 3B or 3C may be used.

In the third embodiment concerning manufacture of exposure masks for layers #1 and #2, the exposure gap is changed between the layers #1 and #2, to thereby change the pattern period or pattern size to be transferred. However, the pattern size can be changed and controlled by changing the exposure amount for the fine pattern or rough pattern, during each exposure mask manufacture for these layers. Further, the pattern size can be changed by shifting the condition for obtaining an image of a half period as that of a fine pattern, namely, by shifting the exposure gap, from the gap with which the X-ray intensities at the center of the opening and the center of the absorptive material of the fine pattern become even, to thereby change the X-ray intensity ratio between the centers of the opening and absorptive material.

In the embodiments described above, either a fine pattern or a rough pattern is exposed (transferred) twice through X-ray exposure processes, to thereby produce actual mask patterns. In order to produce an exposure mask by superposing a rough pattern image corresponding to a desired resist image upon an accurately transferred fine pattern image, different exposure processes may be used in combination. For example, a fine pattern image comprising a line-and-space pattern image may be formed through X-ray exposure, while a rough pattern may be formed by using an electron beam patterning apparatus, to produce a mask pattern. Alternatively, an exposure mask may be manufactured by any combination of a DUV exposure process using extreme ultraviolet light such as from an ArF excimer laser, for example, an X-ray reduction projection exposure process using soft X-rays and a reflection type mask, an electron beam simultaneous projection exposure process wherein electrons are projected to a stencil mask and the transmitted electrons are reduced, and an ion beam exposure process wherein ions are projected in place of electrons, for example. A fine mask to be used in various exposure processes is not limited to a mask having an absorptive material of a line-and-space pattern. A mask which utilizes phase shift may be used. For example, in the DUV or EUV exposure process, a mask called a Levenson type mask, having a structure wherein the phase varies periodically, may be used, and a fine pattern may be formed on a resist on the basis of optical interference.

The embodiments described above concern a transmission type X-ray mask for used in proximity X-ray exposure, and the multiple exposure process described above can be applied to production of an actual pattern for a reflection type mask which is suitable for EUV or X-ray exposure.

Figure 6:
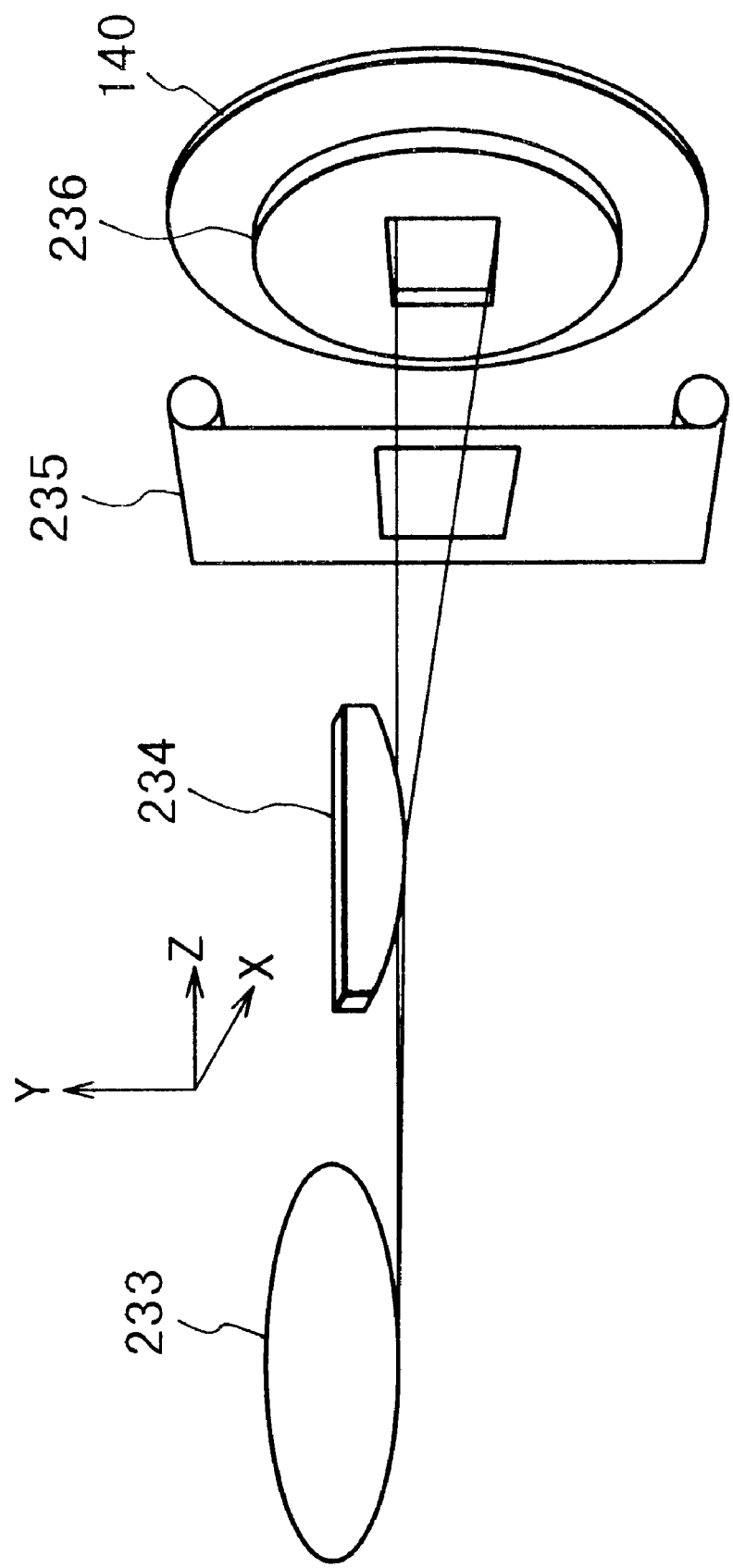
FIG. 6 is a schematic view of an X-ray exposure apparatus.
Figure 7:
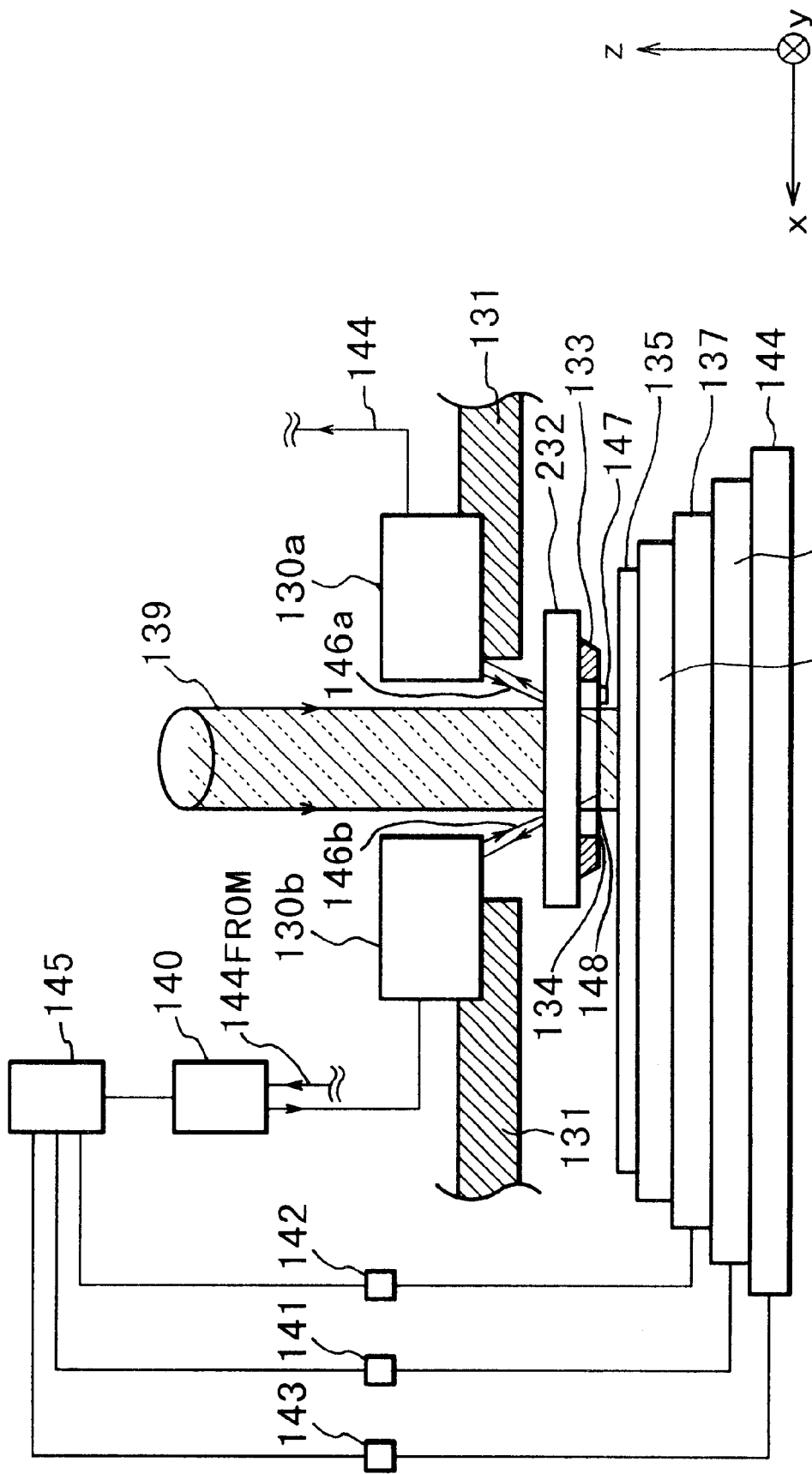
FIG. 7 is a schematic view of a main portion of an X-ray exposure apparatus.

Referring now to FIGS. 6 and 7, an X-ray exposure apparatus and an X-ray exposure method, using an X-ray mask such as described hereinbefore, will be explained.

A synchrotron ring 233 produces a high-luminance X-ray beam which is expanded by a total reflection mirror of an X-ray mirror 234 and is divergently directed to the X-ray exposure apparatus. The exposure amount during a transfer operation is controlled by an exposure amount adjusting movable shutter 235. The X-ray beam passing through the shutter 235 goes through an X-ray mask 236, and it impinges on a resist material applied to a wafer 140, whereby the resist is patterned.

FIG. 7 is a schematic view of a main portion of a semiconductor device manufacturing exposure apparatus using X-rays, into which an X-ray mask structure is incorporated. Denoted in FIG. 7 at 139 is an X-ray beam which is projected to a mask 134 surface. Denoted at 135 is a wafer having its surface coated with an X-ray resist, for example. Denoted at 133 is a mask frame, and denoted at 134 is a mask membrane (mask). There is an IC pattern formed thereon by use of an X-ray absorbing material. Denoted at 148 is a pellicle. Denoted at 147 is a measurement mark which is formed on the pellicle 148, and which is to be used for measurement of the spacing between the pellicle and the wafer 135 or any shift of the pellicle. Denoted at 232 is a mask supporting member, and denoted at 136 is a wafer holding member such as a wafer chuck.

Denoted at 137 is a Z-axis stage which is practically made tiltable. Denoted at 138 is an X-axis stage, and denoted at 144 is a Y-axis stage. The functional components for detecting any positional deviation between the mask and the wafer are accommodated in casings 130a and 130b. From these and the wafer as well as information regarding any positional deviation between them in X and Y directions, are produced. In FIG. 7, although two casings 130a and 130b for two positional deviation detecting functions are illustrated, actually, there are two additional deviation detecting functional components. Thus, the structure includes a total of four functional components corresponding to four corners of a rectangular IC pattern area on the mask 134. In each of the casings 130a and 130b, there are an optical system and a detection system accommodated. Denoted at 140a and 140b are detection lights for detecting positional deviations.

The positions of the X-ray mask and the wafer are adjusted beforehand. The X-ray mask is formed with a circuit pattern defined by an absorptive material. The X-ray beam 139 irradiates the X-ray mask 236, whereby an image of the patterned absorptive material is transferred to the wafer.

While this embodiment concerns an X-ray exposure apparatus, the present invention is not limited to this. It can be applied to any other types of exposure apparatuses.

Figure 8:
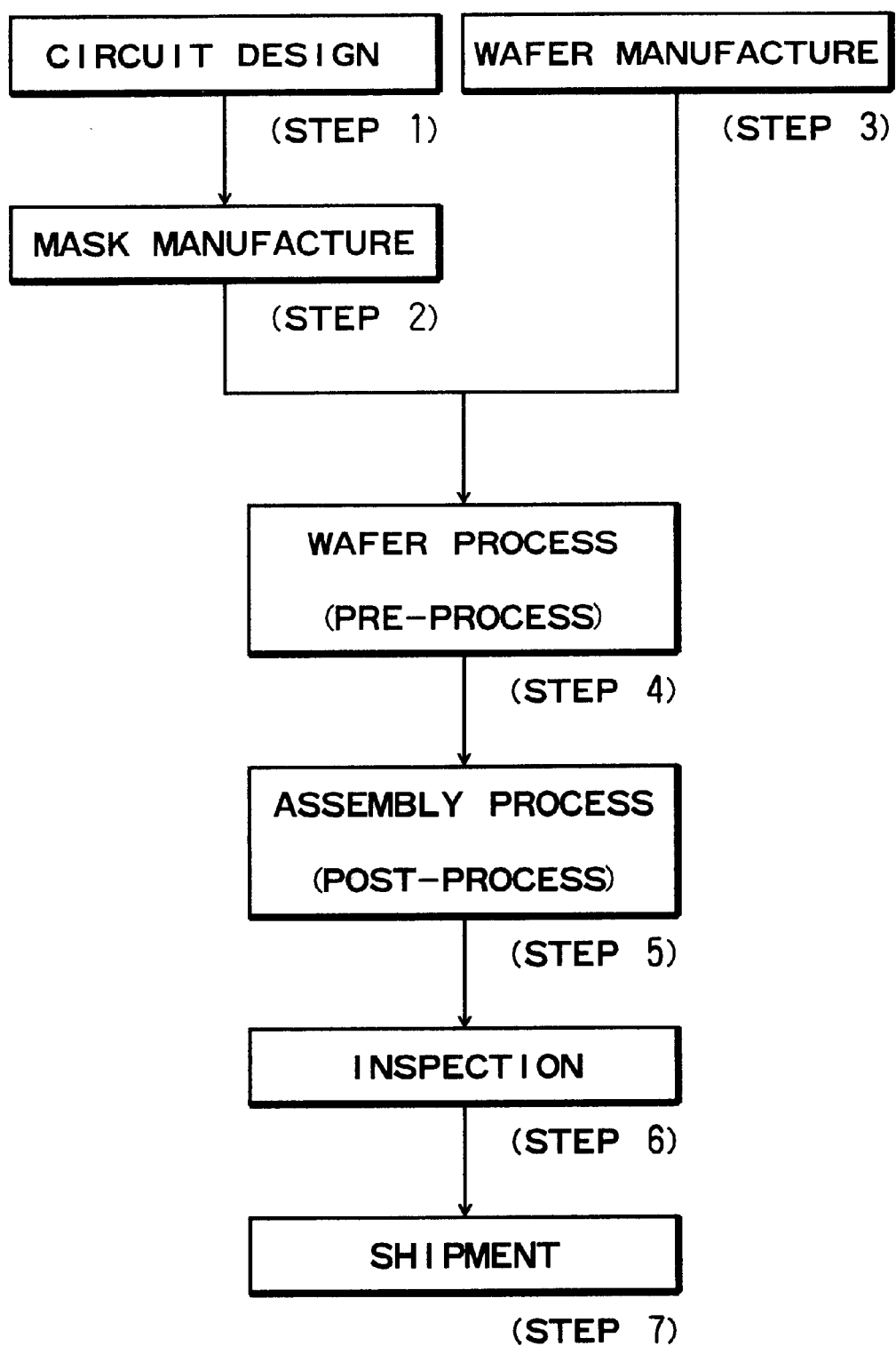
FIG. 8 is a flow chart of semiconductor device manufacturing processes.

FIG. 8 is a flow charge of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
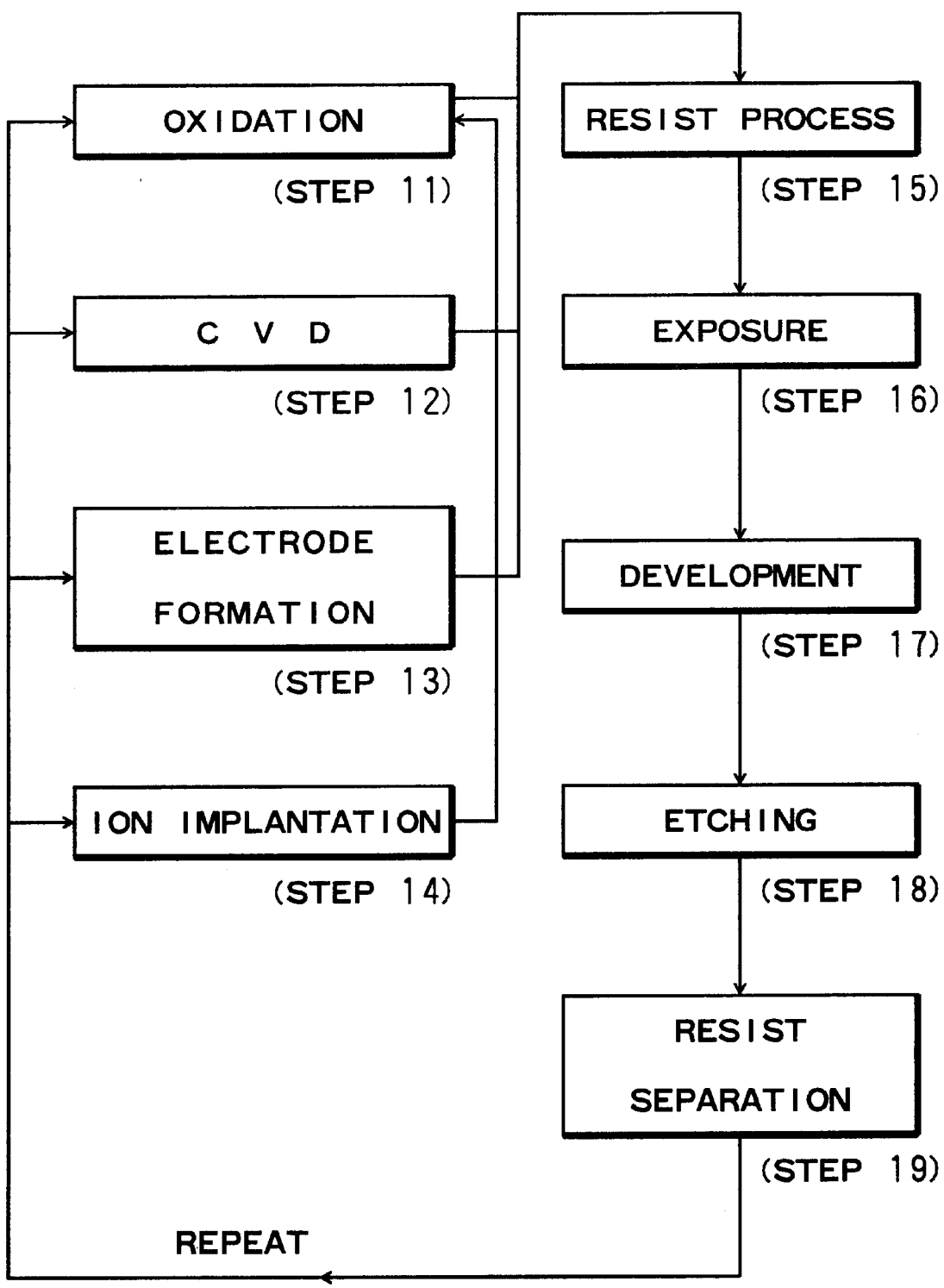
FIG. 9 is a flow chart for explaining details of a wafer process, in the procedure of FIG. 8.
Figure 10A:
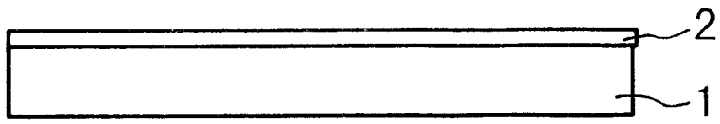
FIGS. 10A–10F are schematic views, respectively, for explaining a conventional mask manufacturing procedure.
Figure 10B:
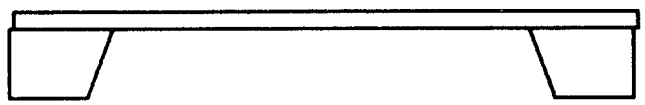
Figure 10C:
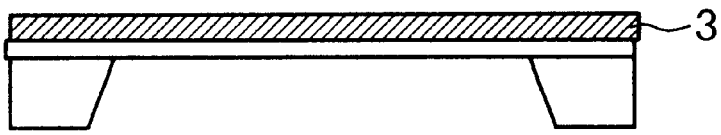
Figure 10D:
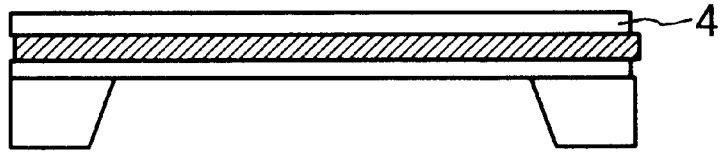
Figure 10E:
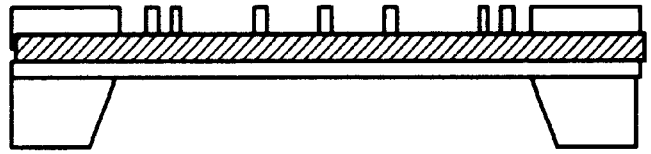
Figure 10F:
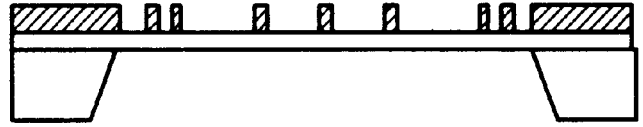

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing an exposure mask having a pattern, said method comprising the steps of:
   coating a substrate with a material for providing the pattern and with a resist;
   performing a multiple exposure process with respect to one and the same region on the coated substrate, so that latent images are superimposed on the region; and
   developing and etching the exposed substrate to produce an exposure mask having the pattern.

2. A method according to claim 1, wherein said multiple exposure process includes (i) a first exposure step for forming a latent image of a relatively-fine periodic pattern on the substrate by use of a first master mask having an absorptive periodic pattern, and (ii) a second exposure step for forming a latent image of a relatively-rough pattern on the substrate by use of a second master mask having an absorptive pattern.

3. A method according to claim 2, wherein the first exposure step includes transferring the pattern of the first master mask onto the substrate with a magnification of 1/N where N is an integer not less than 2.

4. A method according to claim 2, wherein the first exposure step includes adjusting a gap between the first master mask and the substrate.

5. A method according to claim 2, wherein the first master mask is prepared by use of a first electron beam and the second master mask is prepared by use of a second electron beam having an address size and a beam diameter, at least one of which is different from that of the first electron beam.

6. A method according to claim 1, wherein the exposure mask that is produced is used for X-ray lithography.

7. A method according to claim 6, wherein the exposure mask that is produced comprises a structure having a membrane on which the pattern is formed, and a frame for supporting the membrane.

8. A method according to claim 2, wherein, in said first exposure step, one of an X-ray beam and a deep ultraviolet ray beam is used to produce the latent images of the relatively-fine pattern, and, in said second exposure step, an electron beam is used to produce the latent images of the relatively-rough pattern.

9. A method according to claim 1, wherein said multiple exposure process includes:
   (i) a first exposure step using a first mask pattern, for forming a latent image of the first mask pattern on the substrate, wherein, in said first exposure step, a first region in which an exposure amount does not reach an exposure threshold value is produced; and
   (ii) a second exposure step using a second mask pattern different from the first mask pattern, for forming a latent image of the second mask pattern on the substrate, wherein, in said second exposure step, a second region in which an exposure amount does not reach an exposure threshold value is produced,
   wherein at least a portion of the region in which the first and second regions overlap with each other has been exposed with an exposure amount greater than the exposure threshold value.

10. A semiconductor device manufacturing method, comprising the steps of:
   preparing an exposure mask produced in accordance with a method as recited in claim 1;
   using the prepared exposure mask in an exposure process so that a pattern of the exposure mask is transferred to a wafer; and developing the wafer having the pattern transferred thereto.

11. A method according to claim 10, further comprising using X-rays in the exposure process.

12. An exposure apparatus for transferring a mask pattern onto a substrate, by use of a mask prepared in accordance with a method as recited in claim 1.

13. A method of manufacturing plural exposure masks each having a pattern, said method comprising:

a first procedure for producing a first exposure mask having a first pattern, said first procedure including the steps of (a) coating a first substrate with a material for providing the first pattern with a resist, (b) performing a first multiple exposure process with respect to one and the same region on the coated first substrate, so that latent images are superimposed on the region, and (c) developing and etching the exposed first substrate to produce the first pattern, wherein said first multiple exposure process includes (i) a first exposure step for forming a latent image of relatively-fine periodic pattern on the first substrate by use of a first master mask having absorptive periodic pattern, and (ii) a second exposure step for forming a latent image of relatively-rough pattern on the first substrate by use of a second master mask having absorptive pattern; and a second procedure for producing a second exposure mask having a second pattern different from the first pattern, said second procedure including the steps of (a) coating a second substrate with a material for the second pattern and with a resist, (b) performing a second multiple exposure process with respect to one and the same region on the coated second substrate, so that latent images are superimposed on the region, and (c) developing and etching the exposed second substrate to produce the second pattern, wherein said second multiple exposure process includes (i) a third exposure step for forming a latent image of a relatively-fine periodic pattern on the second substrate by use of a third master mask having an absorptive periodic pattern, and (ii) a fourth exposure step for forming a latent image of a relatively rough pattern on the second substrate by use of a fourth master mask having an absorptive pattern, and wherein the third master mask is the same as the first master mask.

14. A method according to claim 13, wherein (i) in said first exposure step, a first region in which an exposure amount does not reach an exposure threshold value is produced, (ii) in said second exposure step, a second region in which an exposure amount does not reach an exposure threshold value is produced, (iii) at least a portion of the region in which the first and second regions overlap with each other has been exposed with an exposure amount greater than the exposure threshold value, (iv) in said third exposure step, a third region in which an exposure amount does not reach an exposure threshold value is produced, (v) in said fourth exposure step, a fourth region in which an exposure amount does not reach an exposure threshold value is produced, and (vi) at least a portion of the region in which the third and fourth regions overlap with each other has been exposed with an exposure amount greater than the exposure threshold value.

* * * * *

UNITED STATES PATENT AND TRADEMARK OFFICE
CERTIFICATE OF CORRECTION

PATENT NO. : 6,455,203 B1
DATED : September 24, 2002
INVENTOR(S) : Mitsuaki Amemiya et al.

It is certified that error appears in the above-identified patent and that said Letters Patent is hereby corrected as shown below:

Column 7,
Line 47, "and" should be deleted.

Column 8,
Line 19, "a n" should read -- an --.
Line 35, "manufactured" should read -- manufactured, --.
Line 41, "draft" should read -- drift --.

Column 10,
Line 35, "used" should read -- use --.

Column 11,
Line 3, "these" should read -- these blocks, information regarding the gap between the mask --.
Line 24, "charge" should read -- chart --.

Column 13,
Line 20, "of" should read -- of a --.
Line 22, "having" should read -- having an --.
Line 23, "of" should read -- of a --.
Line 25, "having" should read -- having an --.

Signed and Sealed this

Twenty-fifth Day of February, 2003

JAMES E. ROGAN
*Director of the United States Patent and Trademark Office*